United States Patent
Tanaka et al.

(10) Patent No.: US 8,613,136 B2
(45) Date of Patent: *Dec. 24, 2013

(54) METHOD OF MANUFACTURING PRINTED WIRING BOARD WITH BUILT-IN ELECTRONIC COMPONENT

(75) Inventors: Hironori Tanaka, Ogaki (JP); Kazuhiro Yoshikawa, Ogaki (JP); Naoaki Fujii, Ogaki (JP); Atsunari Yamashita, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 1078 days.

This patent is subject to a terminal disclaimer.

(21) Appl. No.: 12/614,576

(22) Filed: Nov. 9, 2009

(65) Prior Publication Data
US 2010/0043942 A1    Feb. 25, 2010

Related U.S. Application Data

(62) Division of application No. 12/351,929, filed on Jan. 12, 2009, now Pat. No. 7,935,893.

(60) Provisional application No. 61/028,824, filed on Feb. 14, 2008.

(51) Int. Cl.
   *H01K 3/10*    (2006.01)
(52) U.S. Cl.
   USPC ............ 29/852; 29/832; 29/841; 29/846; 174/258; 174/260; 174/262
(58) Field of Classification Search
   USPC ......... 29/832, 841, 846; 174/258, 260, 262
   See application file for complete search history.

(56) References Cited

U.S. PATENT DOCUMENTS

| | | | |
|---|---|---|---|
| 6,038,133 A | 3/2000 | Nakatani et al. | |
| 6,370,013 B1 | 4/2002 | Iino et al. | |
| 6,724,638 B1 | 4/2004 | Inagaki et al. | |
| 8,024,858 B2 * | 9/2011 | Tanaka et al. | 29/852 |
| 8,237,060 B2 * | 8/2012 | Tanaka | 174/260 |
| 8,336,205 B2 * | 12/2012 | Tanaka et al. | 29/852 |
| 2005/0039948 A1 | 2/2005 | Asai et al. | |
| 2006/0105500 A1 | 5/2006 | Chang | |
| 2006/0191711 A1 | 8/2006 | Cho et al. | |
| 2007/0227765 A1 | 10/2007 | Sakamoto et al. | |
| 2009/0008765 A1 | 1/2009 | Yamano et al. | |

FOREIGN PATENT DOCUMENTS

| | | |
|---|---|---|
| JP | 05-037151 | 2/1993 |
| JP | 11-220262 | 8/1999 |
| JP | 2002-271033 A | 9/2002 |
| JP | 2004-343021 A | 12/2004 |

(Continued)

*Primary Examiner* — Carl Arbes
(74) *Attorney, Agent, or Firm* — Oblon, Spivak, McClelland, Maier & Neustadt, L.L.P.

(57) ABSTRACT

A printed wiring board is manufactured by a method in which a laminate body having a first insulation layer and a conductive film is provided. An alignment mark is formed in the laminate body by removing at least a portion of the conductive film. An electronic component is placed on an adhesive layer provided on the first insulation layer at a position determined based on the alignment mark. After the electronic component is enclosed inside an opening of the second insulation layer, a via hole exposing a terminal of the electronic component is formed at a position determined based on the alignment mark used to determine the position of the electronic component. A via conductor is formed in the via hole, and a conductive layer is formed on the conductive film and patterned to form a conductive circuit connected to the via conductor.

16 Claims, 10 Drawing Sheets

(56) References Cited

FOREIGN PATENT DOCUMENTS

| JP | 2007-019267 A | 1/2007 |
| JP | 2007-049004 A | 2/2007 |
| JP | 2007-088009 A | 4/2007 |
| JP | 2008-010885 A | 1/2008 |
| WO | WO 2004/089048 A1 | 10/2004 |
| WO | WO 2005/104635 A1 | 11/2005 |

* cited by examiner

METHOD OF MANUFACTURING PRINTED WIRING BOARD WITH BUILT-IN ELECTRONIC COMPONENT

CROSS-REFERENCE TO RELATED APPLICATIONS

This application is a divisional of U.S. patent application Ser. No. 12/351,929, filed Jan. 12, 2009, which claims the benefit of U.S. Provisional Patent Application No. 61/028,824, filed Feb. 14, 2008, which applications are incorporated herein by reference in their entireties.

BACKGROUND OF THE INVENTION

A printed wiring board typically has a chip capacitor mounted on its surface to achieve an efficient power supply to an IC chip. In an effort to shorten the distance between the chip capacitor and IC chip, a printed wiring board having a chip capacitor built into the board has been manufactured. Also, a printed wiring board with a built-in IC chip has been made to reduce the weight and thickness of the board and achieve a more efficient power supply.

International Publication WO 2004-089048 (hereinafter, "the '048 publication") describes a method of manufacturing an electronic module. In this method, an electronic component is attached to a surface of a conductive layer, and a conductor is formed to connect the conductive layer and the terminals of the electronic component. A conductive pattern is formed from the conductive layer, thereby obtaining an electronic module. However, this electronic module has the following problems. The electronic component is adhered to the surface of the conductive layer such as copper foil. Copper foil is not firm and is easy to warp. A thin copper foil is harder to use, while a thick copper foil does not allow one to form fine-pitch wiring by etching. Also, if the copper foil (conductive layer) warps, the wiring in the warped section may snap, causing wiring breakage. In addition, when a via conductor for connection with a terminal of the electronic component is formed in the warped section of the copper foil (conductive layer), the connection reliability of the via conductor is reduced. The copper foil tends to warp at the time of thermosetting a resin coated on the copper foil because the resin shrinks while curing. Accordingly, the manufacturing method and the structure of the electronic module described in the '048 publication is less desirable in terms of increasing productivity.

BRIEF SUMMARY OF THE INVENTION

The invention provides a method of manufacturing a printed wiring board. In a method according to one embodiment of the present invention, a laminate body having a first insulation layer and a conductive film is provided. The conductive film is provided on a first surface of the first insulation layer. An alignment mark is formed in the laminate body by removing at least a portion of the conductive film. An adhesive layer is provided on a second surface of the first insulation layer opposite to the first surface. The adhesive layer is provided at a position determined based on the alignment mark. An electronic component is placed on the adhesive layer at a position determined based on the alignment mark. A second insulation layer having an opening for enclosing an electronic component is provided on the second surface of the first insulation layer such that the electronic component is positioned in the opening. A third insulation layer is formed over the second insulation layer to enclose the electronic component inside the opening of the second insulation layer. A via hole is formed in the laminate body to expose a terminal of the electronic component. The via hole is formed at a position determined based on the alignment mark. A surface of the laminate body and a surface of the via hole are plated to form a via conductor in the via hole and to form a conductive layer on the laminate body. The via conductor is connected to the terminal of the electronic component. The conductive layer is patterned to form a conductive circuit connected to the via conductor.

BRIEF DESCRIPTION OF THE SEVERAL VIEWS OF THE DRAWING(S)

FIGS. 1(A)-1(D) are cross-sectional views of a laminate body of a multilayer substrate being manufactured by a method according to a first embodiment of the present invention.

FIGS. 2(A)-2(D) are cross-sectional views of the multilayer substrate being manufactured by the method according to the first embodiment.

FIGS. 3(A)-3(C) are cross-sectional views of the multilayer substrate being manufactured by the method according to the first embodiment.

Figure 6A:
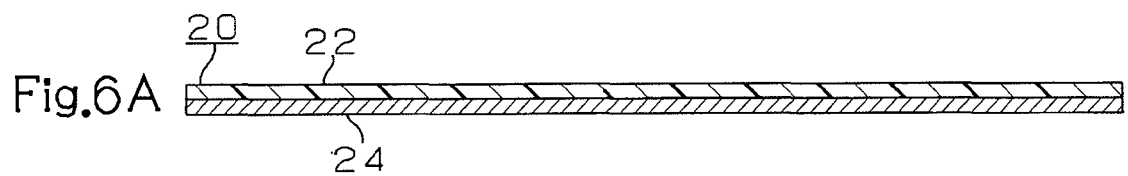
Figure 6B:
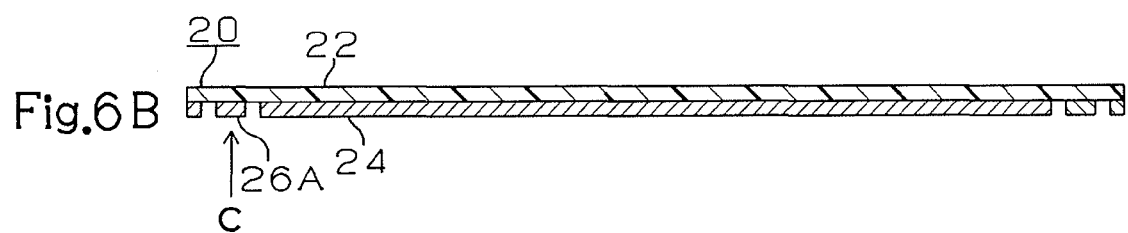
Figure 6C:
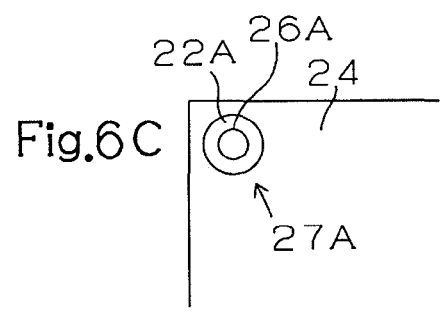

FIGS. 6(A) and 6(B) are cross-sectional views of a laminate body of a multilayer substrate being manufactured by a method according to a second embodiment of the present invention. FIG. 6(C) is a plan view showing an alignment mark viewed from the direction of "C" shown in FIG. 6(B).

Figure 7A:
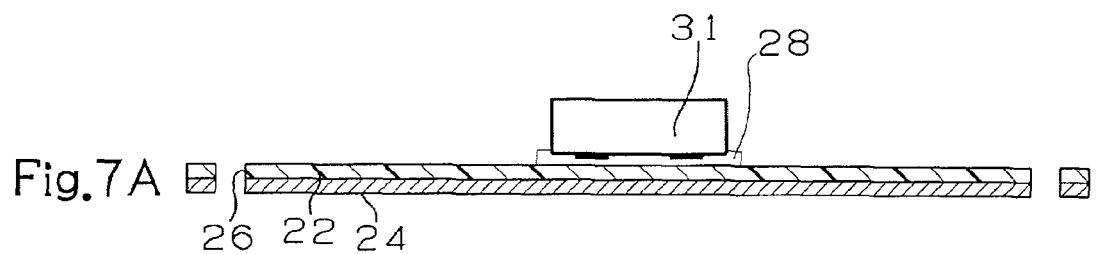
Figure 7B:
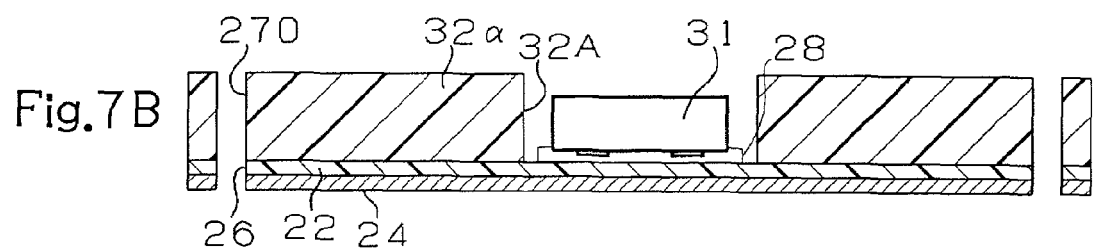
Figure 7C:
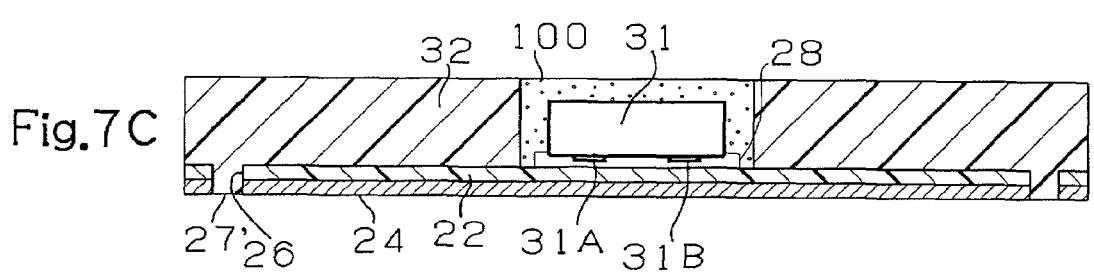

FIGS. 7(A)-7(C) are cross-sectional views of a multilayer substrate being manufactured by a method according to a third embodiment.

Figure 8A:
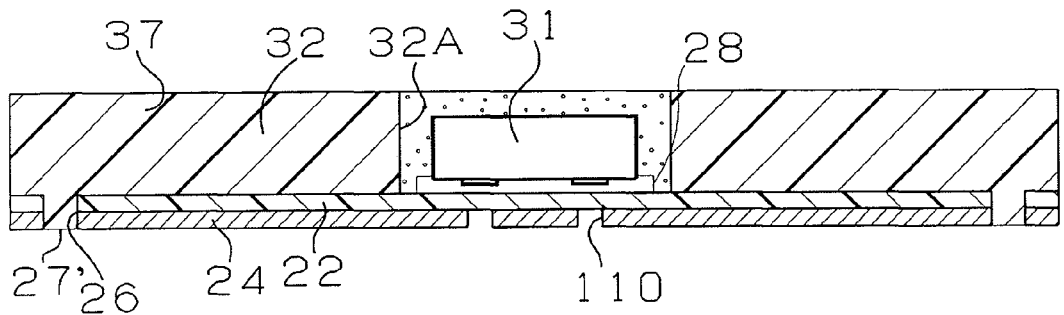
Figure 8B:
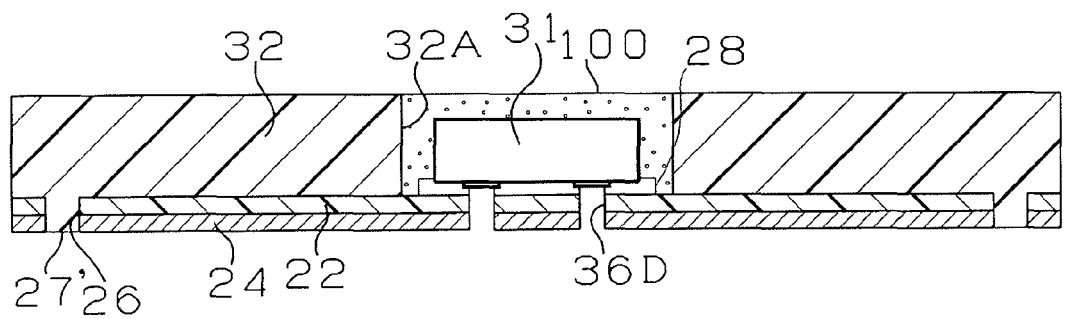
Figure 8C:
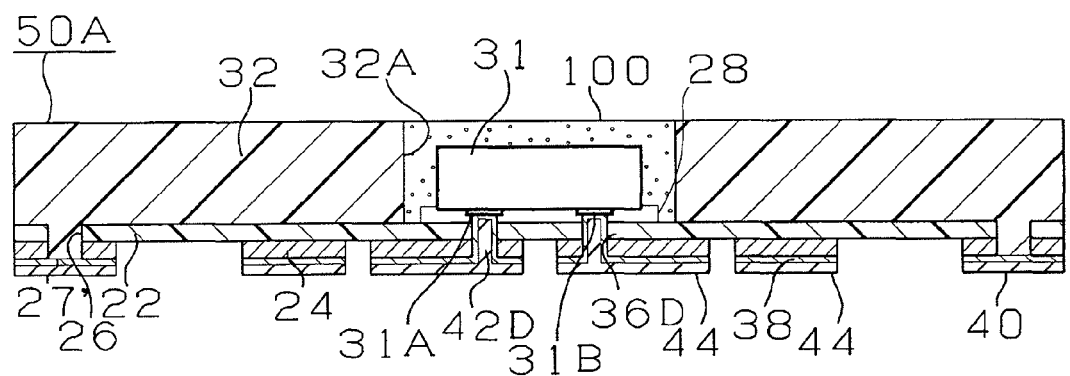

FIGS. 8(A)-8(C) are cross-sectional views of the multilayer substrate being manufactured by the method according to the third embodiment.

Figure 9A:
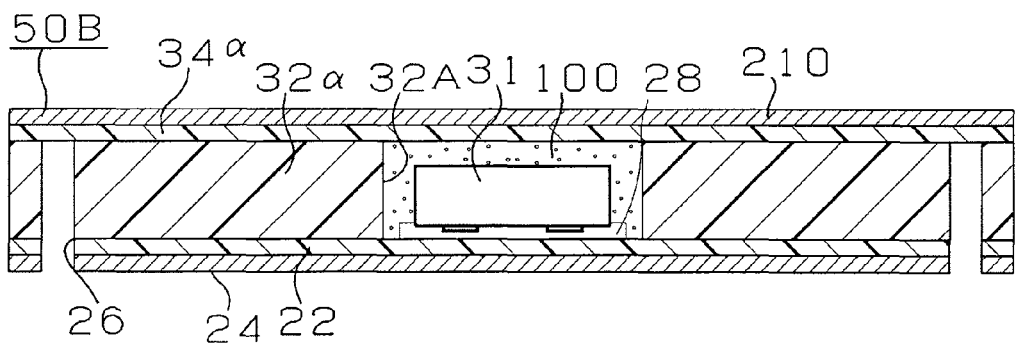
Figure 9B:
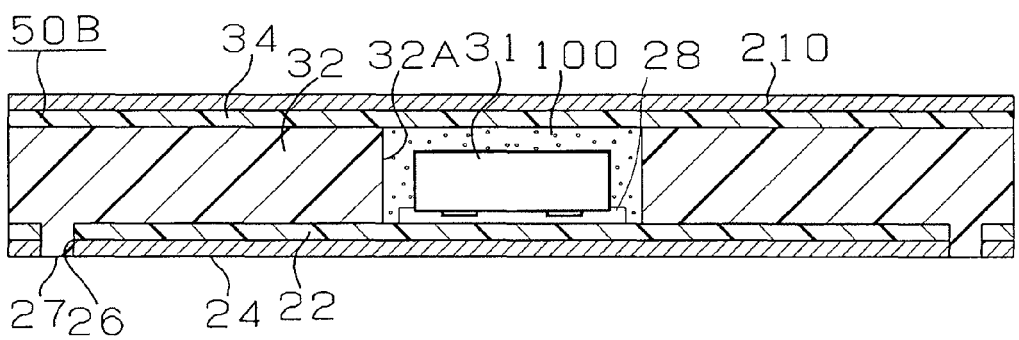
Figure 9C:
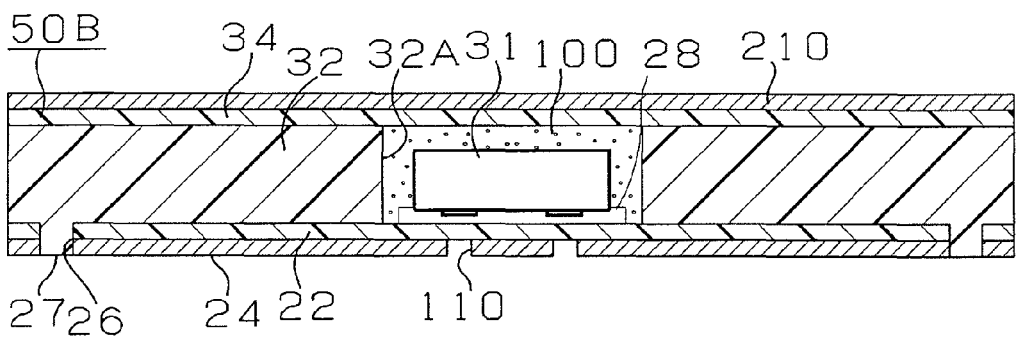

FIGS. 9(A)-9(C) are cross-sectional views of a multilayer substrate being manufactured by a method according to a fourth embodiment.

Figure 10A:
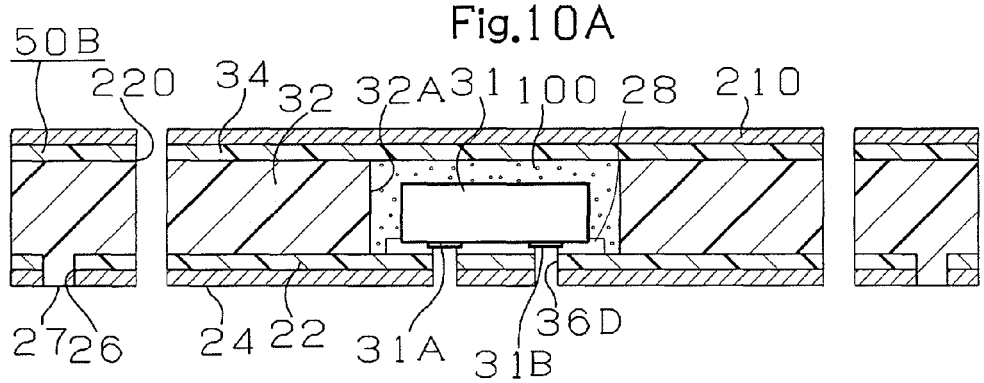
Figure 10B:
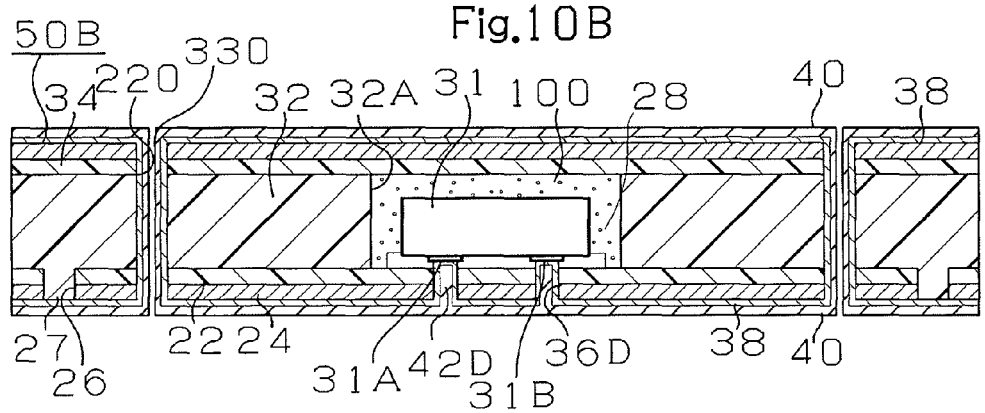
Figure 10C:
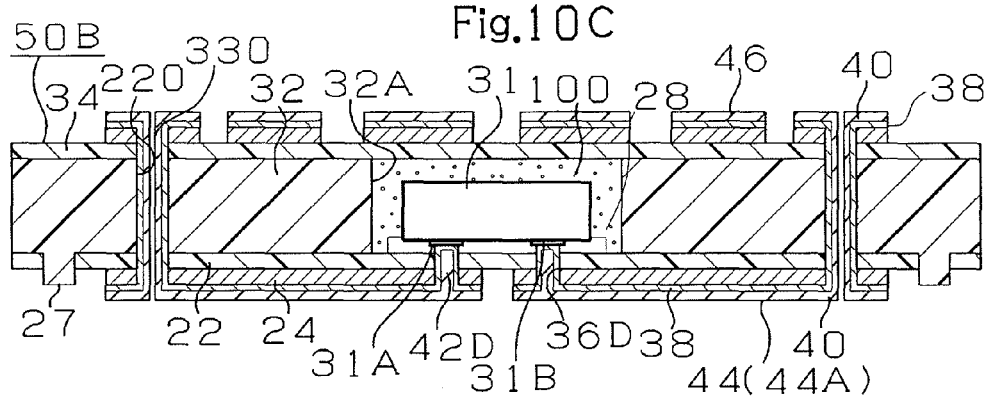

FIGS. 10(A)-10(C) are cross-sectional views of the multilayer substrate being manufactured by the method according to the fourth embodiment.

DETAILED DESCRIPTION OF THE INVENTION

First Embodiment

Figure 3A:
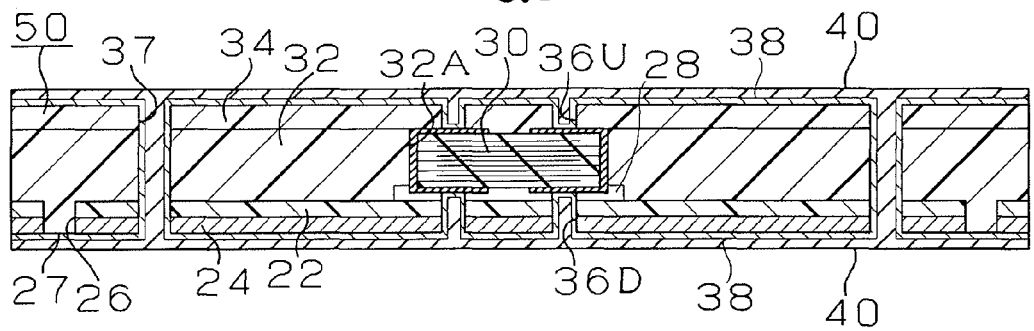
Figure 3B:
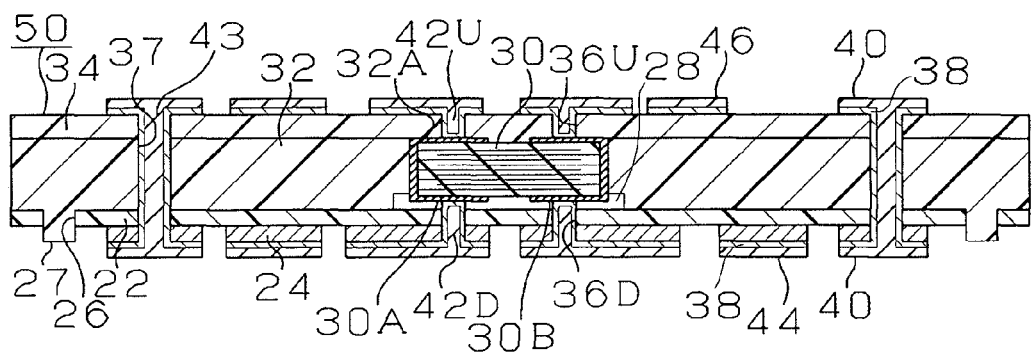
Figure 3C:
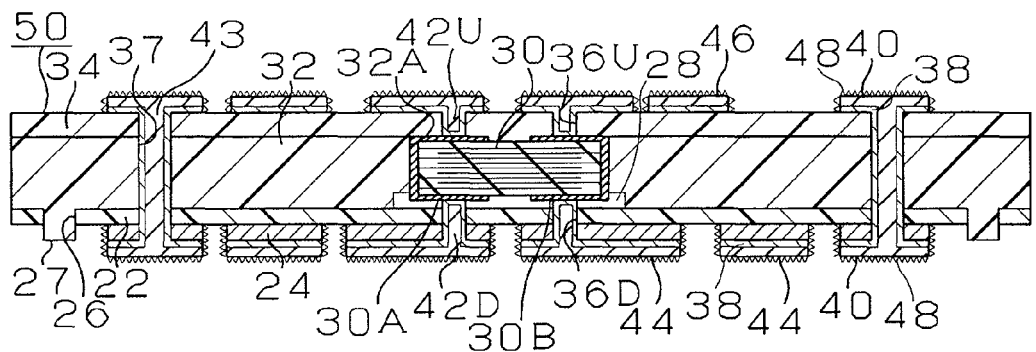

FIG. 3(C) is a cross-sectional view of a multilayer substrate according to a first embodiment of the present invention. A multilayer substrate 50 has three insulation layers: first insulation layer 22, second insulation layer 32 and third insulation layer 34. Hereinafter, the bottom surface of a layer in the drawings is referred to as a first surface, and a top surface is referred to as a second surface. In the multilayer substrate 50 of FIG. 3(C), the second surface of the first insulation layer 22 is in contact with the first surface of the second insulation layer 32. The second surface of the second insulation layer 32 is in contact with the first surface of the third insulation layer 34.

On the first surface of the first insulation layer 22, conductive circuits 44 are formed. The conductive circuits 44 are comprised of conductive film 24, electroless plated film 38 and electrolytic plated film 40. On the second surface of the third insulation layer 34, conductive circuits 46 are formed. Conductive circuits 46 are comprised of electroless plated film 38 and electrolytic plated film 40.

The multilayer substrate 50 also has chip capacitor 30 accommodated in opening portion (32A) formed in the second insulation layer 32. The chip capacitor 30 has terminals (30A, 30B) and is provided on an adhesive layer 28. Via conductors (42D) are provided in via holes (36D) formed in the first insulation layer 22 to connect the terminals (30A, 30B) of the chip capacitor 30 and conductive circuits 44 formed on the first insulation layer 22. Via conductors (42U) are provided in via holes (36U) formed in the third insulation layer 34 to connect the terminals (30A, 30B) of the chip capacitor and conductive circuits 46 of the third insulation layer 34. Also, in the multilayer substrate 50, through-hole conductors 43 are formed in through-holes 37 to establish electrical connection between the conductive circuits 44 formed on the first insulation layer 22 and the conductive circuits 46 formed on the third insulation layer 34.

Furthermore, the multilayer substrate 50 has alignment marks 27 formed by filling through-holes 26 with insulative material. The chip capacitor 30 is positioned on the first insulation layer 22 based on the alignment marks 27. Based on the same alignment marks 27, openings for the via holes (36U, 36D) are formed at desired locations, and the via conductors (42U, 42D) are provided in the via holes (36U, 36D), respectively. By positioning the chip capacitor 30 and the via conductors (42U, 42D) based on the same alignment marks 27, the terminals (30A, 30B) of chip capacitor 30 are more precisely aligned with the via conductors (42U, 42D). Accordingly, the connection reliability between the terminals of the chip capacitor 30 and via conductors (42U, 42D) is enhanced.

In the embodiment illustrated in FIG. 3(C), the alignment mark 27 is the through-hole 26 filled with insulative material. The through-hole 26 is formed in the conductive film 24 and the first insulation layer 22 (FIG. 1(D)). The through-hole 26 functions as an alignment mark that can be observed and detected from both sides of the laminated body 20 (see FIG. 1(D)). Therefore, the loading position of the electronic component (the chip capacitor 30 in this embodiment) is determined more accurately while observing the through-hole 26 with, for example, a camera or an X-ray device from the same side, that is, the second-surface side of the first insulation layer 22. Also, the via holes (36U, 36D) are formed at precise positions while observing the alignment mark 27 with, for example, a camera or an X-ray device from the same side, that is the first-surface side of the first insulation layer 22 (the side where the conductive film 24 is provided).

In addition, the multilayer substrate 50 of the first embodiment has the chip capacitor 30 provided over the first insulation layer 22 and the conductive film 24. Because the chip capacitor 30 is not directly in contact with the conductive film 24, wrinkles are seldom formed in the conductive film 24. Accordingly, defects such as wiring breakage due to a snap in the warped portion or connection breakage due to warping where via conductors are formed are minimized or do not occur.

Figure 4:
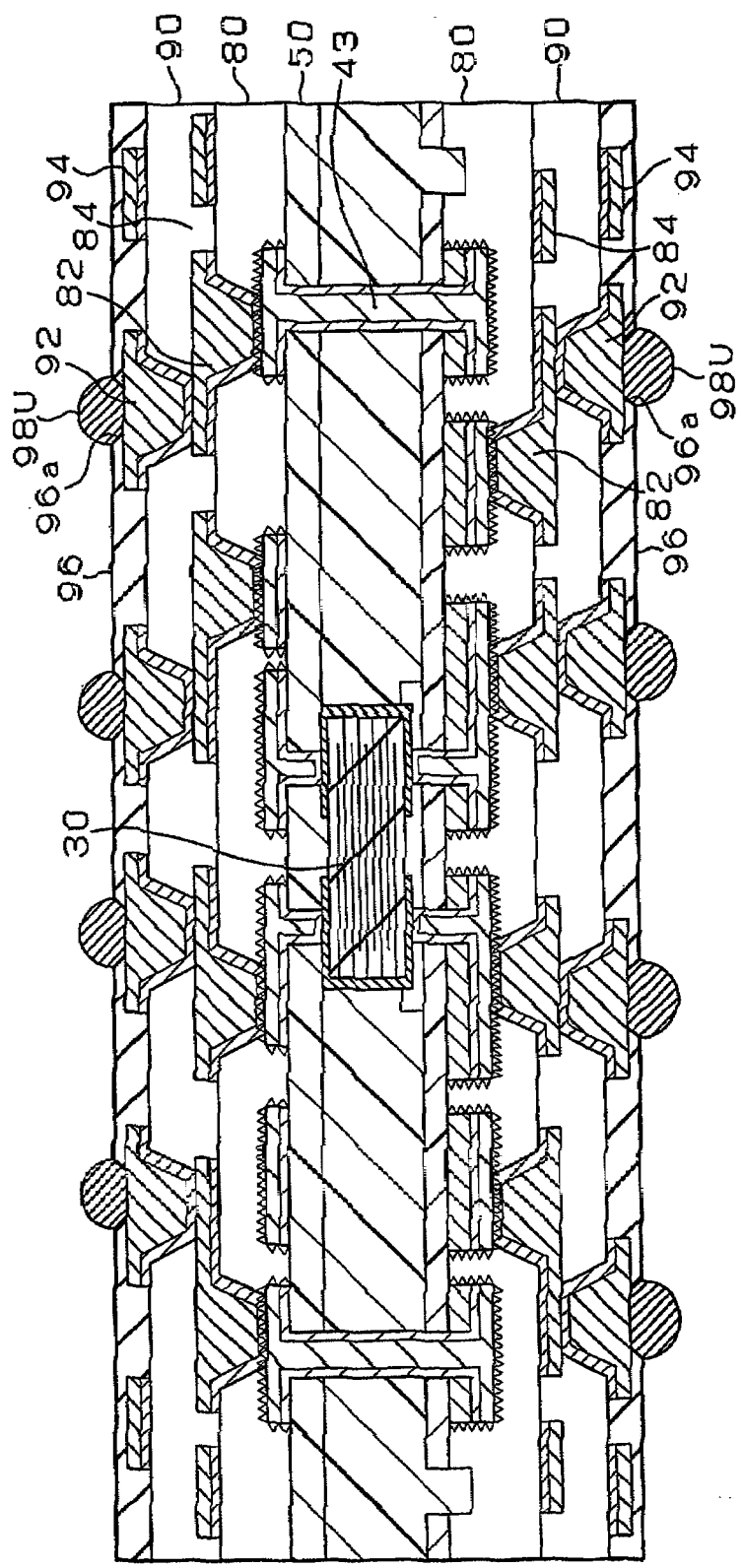
FIG. 4 is a cross-sectional view of a printed wiring board having the multilayer substrate of the first embodiment.

As shown in FIG. 3(C), the surfaces of the conductive circuits 46 and via conductors (42D, 42U), and the surfaces of through-hole conductors 43 are preferred to be roughened to form roughened surfaces 48. The surfaces of interlayer insulation layers (80, 90) in FIG. 4 are also preferred to be roughened.

The multilayer substrate 50 described above can be used as a core substrate of a built-up multilayer printed wiring board. FIG. 4 is a cross-sectional view of a built-up multilayer printed wiring board having the multilayer substrate 50. The multilayer substrate 50 has the chip capacitor 30 incorporated therein. On both surfaces of the core substrate (multilayer substrate 50), interlayer insulation layers (80, 90) and conductive circuits (84, 94) are laminated alternately. The conductive circuits 84 formed on the core substrate 50 and the conductive circuits 94 formed on lower interlayer insulation layer ("lower insulation layer") 80 are connected through via conductors 82 formed in the lower insulation layers 80. Also, the conductive circuits 84 formed on lower insulation layers 80 and the conductive circuits 94 formed on upper interlayer insulation layer ("upper insulation layer") 90 are connected through via conductors 92 formed in the upper insulation layer 90. Solder resist layer 96 is formed on each of the upper insulation layers 90. In openings (96a) of the solder resist layer 96, solder bumps (98U) are formed.

Figure 5:
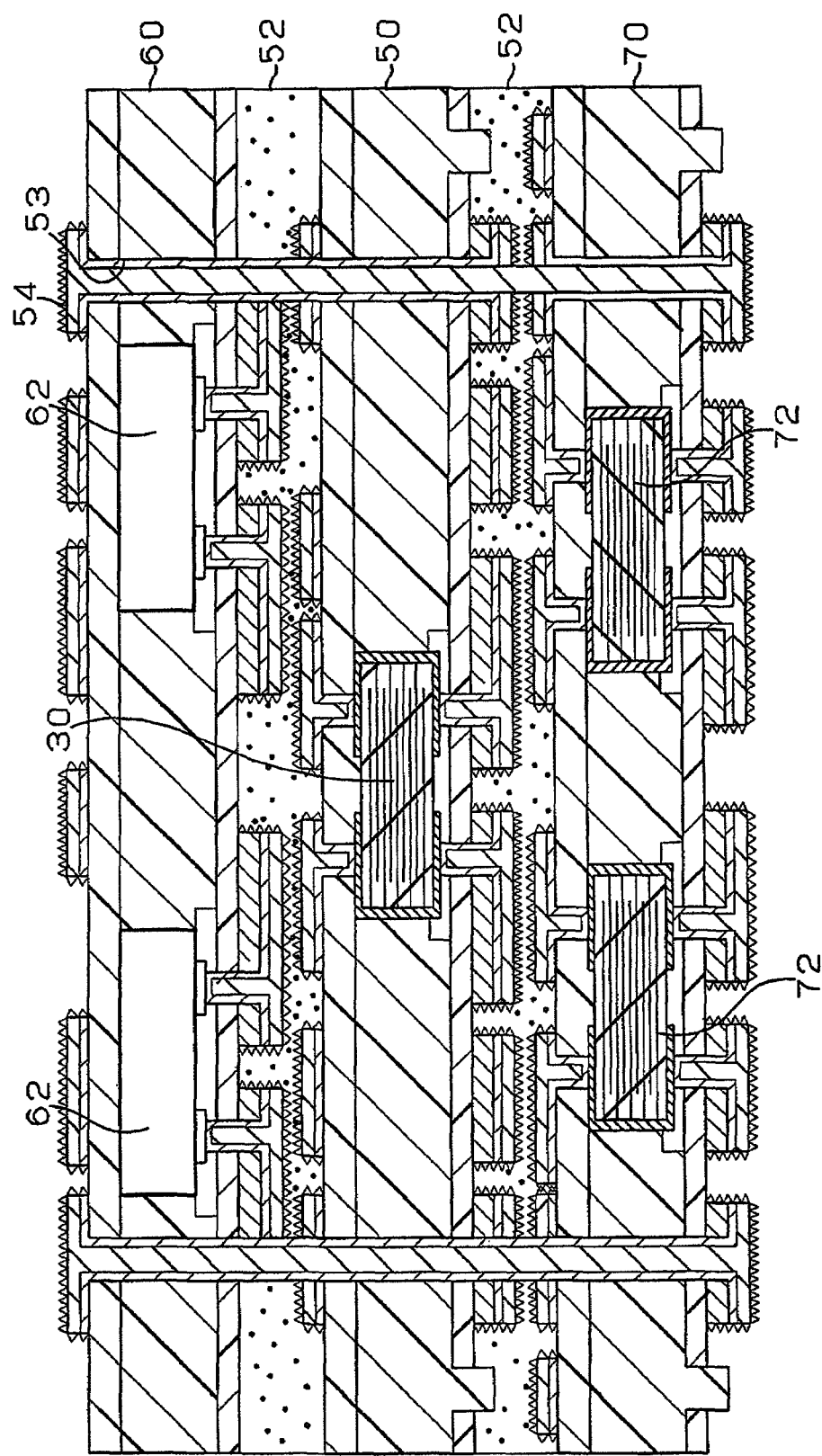
FIG. 5 is a cross-sectional view of a multilayer built-up wiring board formed by laminating built-up layers on the multilayer substrate of the first embodiment.

A printed wiring board may be formed by laminating more than one multilayer substrate. FIG. 5 is a cross-sectional view of a printed wiring board including three multilayer substrates (50, 60, 70) laminated via adhesive layers 52. After laminating, through-holes 53 are formed, and through-hole conductors are formed in the through-holes 53 to connect the multilayer substrates (50, 60, 70). The through-hole conductor can be comprised of an electroless plated film and an electrolytic plated film. Here, the chip capacitor 30 is accommodated in the multilayer substrate 50, multiple IC chips 62 are accommodated in upper multilayer substrate 60, and multiple chip capacitors 72 are accommodated in lower multilayer substrate 70.

In the following, a method of manufacturing the printed wiring board of FIG. 3(C) is described with reference to FIGS. 1(A)-3(C).

Figure 1A:
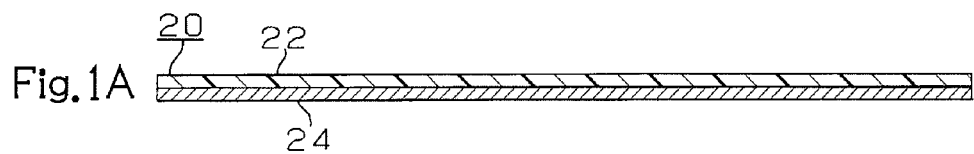

(1) As shown in FIG. 1(A), laminate body 20 having first insulation layer 22 and conductive film 24 provided on the first insulation layer 22 is prepared. The conductive film 24 is provided on the first surface of the first insulation layer 22. The second surface of the first insulation layer 22 is the surface opposite the first surface. For example, the laminate body 20 may be a single-sided copper-clad laminate (copper-clad laminate having a copper foil on one side). A single-sided copper-clad laminate can be made by, for example, laminating an about 18 μm-thick copper foil on a side of the insulation layer. The first insulation layer 22 can be produced by, for example, impregnating an about 0.1 mm-thick core material (for example, glass cloth) with resin such as bismaleimide triazine (BT) or epoxy resin, and curing the material. The conductive film 24 may be a metallic film such as copper foil.

Figure 1B:
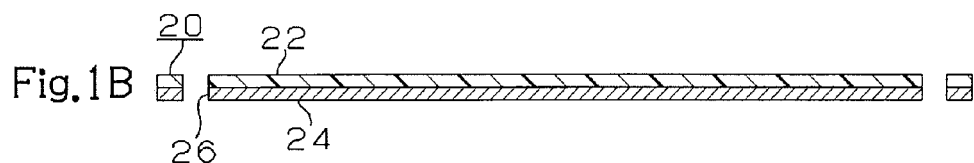

(2) Through-holes 26 are formed at desired locations of the laminate body 20 (see FIG. 1(B)). The through-holes 26 can be formed at the four corners of the laminate body 20 by using, for example, a laser or a drill. The through-holes 26 function as alignment marks 27 for positioning. Instead of the four corners, the alignment mark can be formed at a position in the laminate body 20 underneath the opening portion (32A) of the second insulation layer 32 where the chip capacitor 30 is to be placed. In such a case, since the alignment mark is formed near the electronic component, the positioning accuracy at the time of loading the electronic component and the positioning accuracy at the time of forming via holes is enhanced. The alignment mark may be formed as a through-hole penetrating the laminated body 20 or as a conductor formed on the first surface of the first insulation layer 22 (see FIGS. 6(B) and 6(C)). When an alignment mark is made from a conductor, a portion of the conductive film 24 around the conductor is removed.

Figure 1C:
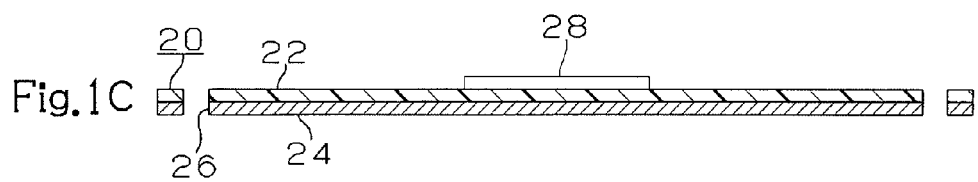

(3) Next, adhesive layer 28 is formed on the second surface of the first insulation layer 22 of the laminate body 20 (see FIG. 1(C)). The adhesive layer 28 may be comprised of insulative resin. The position of the adhesive layer 28 is determined by using the through-holes 26. The adhesive layer 28 can be formed by coating or potting. By doing so, the uncured material of the adhesive layer 28 can fill the space between chip capacitor 30 and insulation layers surrounding the chip capacitor 30 in the pressing process described later.

Figure 1D:
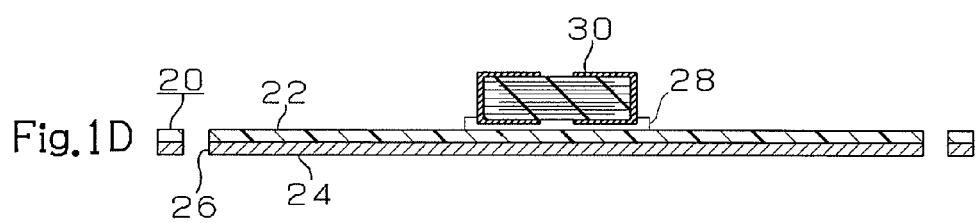

(4) The chip capacitor 30 is loaded on the laminate body 20 via the adhesive layer 28 (see FIG. 1(D)). The chip capacitor 30 is firmly fixed onto the laminate body 20 by the adhesive layer 28. The position to place the chip capacitor 30 is determined using the through-holes 26 for alignment. Since the alignment marks are through-holes 26, the chip capacitor 30 is positioned more accurately while observing the alignment marks with a camera or an X-ray device from the second surface side of the first insulation layer 22, that is, from the above in the drawing. Also, one or multiple chip capacitors 30 may be mounted on the laminate body 20. By using multiple chip capacitors 30, highly integrated capacitors are achieved.

Figure 2A:
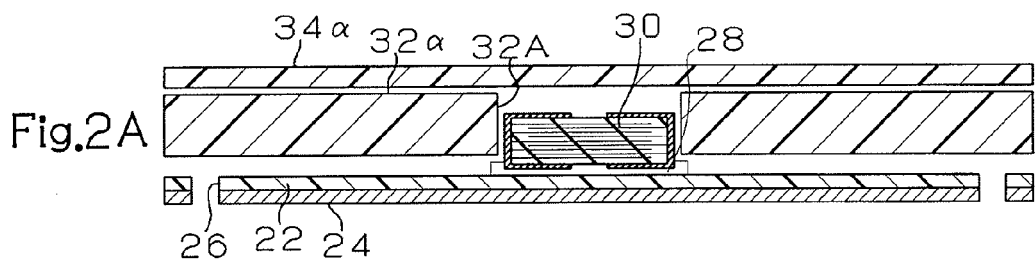

(5) Next, as shown in FIG. 2(A), insulation layers surrounding the chip capacitor 30 are prepared. Here, prepreg (32α) and prepreg (34α) are prepared. The prepregs (32α, 34α) can be insulative resin layers (such as epoxy resin), which are uncured, semi-cured, or not fully cured. The prepreg (32α) may be about 0.4 mm thick, and prepreg (34α) may be about 0.1 mm thick. Prepregs (32α, 34α) may be made by impregnating resin, for example, epoxy resin or BT resin, in a core material such as glass cloth. In the prepreg (32α), opening portion (32A) is formed to accommodate chip capacitor 30. On the first insulation layer 22, prepreg (32α) and prepreg (34α) are disposed (see FIG. 2(A)). Prepreg (32α) is positioned on the first insulation layer 22 by aligning the opening portion (32A) of prepreg (32α) and the chip capacitor 30. By doing so, chip capacitor 30 is desirably accommodated or enclosed inside multilayer substrate 50, and thus loop inductance is reduced.

Figure 2B:
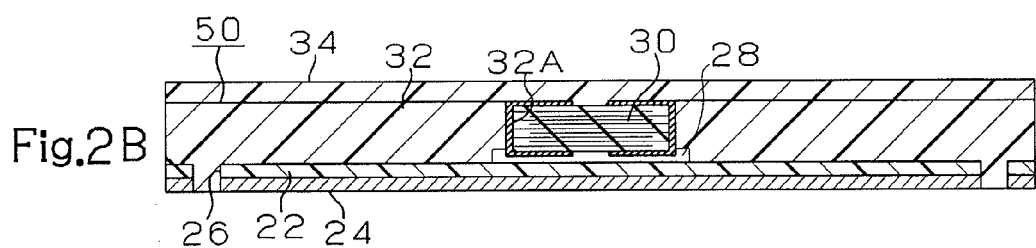

(6) By pressing the laminated layers, first insulation layer 22, second insulation layer 32 and third insulation layer 34 are integrated to form the multilayer substrate 50 with chip capacitor 30 accommodated and fixed therein (see FIG. 2(B)). This pressing process may be thermopressing. For example, a pressure of about 20 kg/cm² and a heat of about 150° C. may be applied.

In this pressing process, resin material is squeezed from prepregs (32α, 34α) into opening portion (32A). The squeezed resin fills the space around the chip capacitor 30 in the opening portion (32A). The resin is cured, and prepreg (32α) becomes the second insulation layer 32, and prepreg (34α) becomes the third insulation layer 34. The resin pressed out to the opening portion (32A) is cured and becomes a filler that fills the gap between the chip capacitor 30 and the insulation layers (32, 34) to fix the chip capacitor 30 inside the opening portion (32A) of the second insulation layer 32. Also, the first insulation layer 22, second insulation layer 32 and third insulation layer 34 are firmly adhered to one another.

Instead of filling the space inside the opening (32A) by using the resin material squeezed out of the prepregs (32α, 34α), it is possible to place a filler inside the opening (32A) beforehand. It is also possible to use a cured-resin substrate instead of the prepregs (32α, 34α). The filler is preferred to be comprised of thermosetting resin and inorganic filler (not containing glass fibers or aramid fibers). As for inorganic filler, for example, $Al_2O_3$, MgO, BN, AlN or $SiO_2$ may be used. The amount of the inorganic filler is preferred to be from about 30 wt. % to about 60 wt. %. As for thermosetting resin, for example, epoxy resin, phenolic resin, or cyanate resin, which is heat resistant, is preferred. Among those resins, epoxy resin, with excellent heat resistance, is especially preferred.

The multilayer substrate 50 preferably has the first insulation layer 22 and the third insulation layer 34 having substantially the same the thickness. The multilayer substrate 50 having such insulation layers is less likely to be warped in the thickness direction.

The surfaces of the multilayer substrate 50 are the substantially flat surfaces of the first insulation layer 22 and third insulation layer 34. As such, sufficient flatness of the multilayer substrate 50 is maintained without degrading, which allows a proper formation of conductive circuits (44, 46) and via conductors (42U, 42D) on the multilayer substrate 50 in later steps. Thus, the defect production rate is desirably reduced. Also, the multilayer substrate 50 produced by this method achieves excellent strength.

Figure 2C:
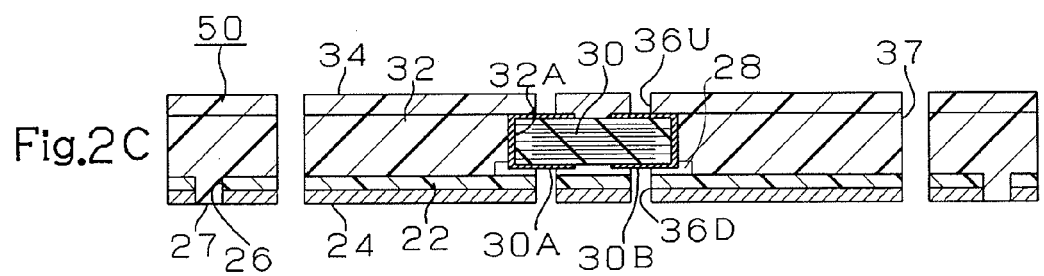

(7) Next, using alignment marks 27 formed by through-holes 26 for alignment, via holes (36D) for via conductors (42D) are formed (see FIG. 2(C)). The via holes (36D) reach terminals (30A, 30B) of the chip capacitor 30. The via holes (36D) may be formed by, for example, a laser in the conductive film 24, first insulation layer 22 and adhesive layer 28. By using a laser, an opening with a small diameter can be formed to allow a fine pitch. Also, via holes (36U) for via conductors (42U) are formed in the filler and third insulation layer 34. The via holes (36U) reach the electrodes of the chip capacitor 30. If the filler is not placed between the electrodes of the chip capacitor 30 and the third insulation layer 34, via holes (36U) are formed in the third insulation layer 30. Also, through-holes 37 are formed in the conductive film 24, first insulation layer 22, second insulation layer 32 and third insulation layer 34 (see FIG. 2(C)). After that, a desmear treatment can be conducted using oxygen plasma. Alternatively, a chemical treatment using, for example, a permanganate solution or the like may be conducted.

The positions to form via holes (36U, 36D) are determined based on the alignment marks 27 used when loading the chip capacitor 30. In other words, the via holes (36U, 36D) are formed by using the same alignment marks 27 used when mounting the chip capacitor 30. Therefore, the via holes (36U, 36D) are positioned accurately without producing a gap with the terminals (electrodes) of the capacitor.

If resin comes out of the prepregs (32α, 34α) and overflows or protrudes from the through-holes 26, it may be hard to recognize the precise location of the through-holes 26 or alignment marks 27. In such a case, the precise location of the through-holes 26 (alignment marks 27) may be determined by detecting them with a camera or X-rays, and second alignment marks may be newly formed based on the alignment marks 27. In such a case, via holes (36U, 36D) are preferred to be formed based on the second alignment marks. The second alignment marks can be through-holes or the like that penetrate multilayer substrate (core substrate) 50.

Figure 2D:
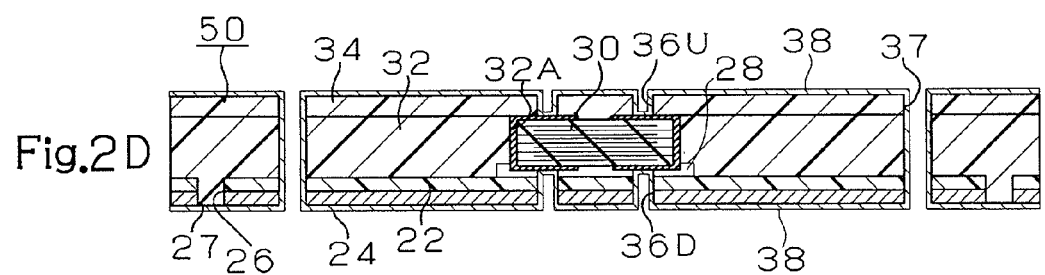

(8) Next, electroless plated films (such as electroless copper-plated films) 38 are formed on the entire exposed surfaces (including the inner walls of via holes (36U, 36D) and through-holes 37) of the multilayer substrate 50 (see FIG. 2(D)). The electroless plated films 38 may be formed by, for example, immersing the multilayer substrate 50 with adhered catalyst in an electroless copper solution. The solution may be commercially available electroless copper plating solution (for example, made by C. Uyemura & Co., Ltd.). The electroless plated films 38 may have a thickness of, for example, about 0.6 μm to about 3.0 μm. The electroless plating may be performed at a solution temperature of 34° C. for about 40 minutes.

(9) Subsequently, electrolytic plated films 40 are formed (see FIG. 3(A)). For instance, the electrolytic plated films 40 are electrolytic copper-plated films formed by immersing the multilayer substrate 50 in an electrolytic plating solution such as a commercially available plating solution (for example, made by C. Uyemura & Co., Ltd.) and applying an electric current through the electroless plated films 38 to perform electrolytic plating. The electrolytic plating may be conducted at 22±2° C. for about 120 minutes at a current density of, for example, about 1 A/Dm$^2$.

(10) The electroless plated films 38 and the electrolytic plated films 40 are patterned to form conductive circuits 46, via conductors (42U) and through-hole conductors 43 (see FIG. 3(B)). First, etching resists with a predetermined pattern are formed on the electrolytic plated films 40. The portions where the etching resist is not formed are dissolved and removed, and the etching resists are removed. After that, by conducting soft etching on the surfaces of the conductive circuits 46, roughened surfaces 48 are formed on the entire exposed surfaces of the patterned electrolytic plated films 40 (see FIG. 3(C)). On the upper-surface side (on the second surface of the third insulation layer 34) of multilayer substrate 50, conductive circuits 46 having electroless plated film 38 and electrolytic plated film 40 are formed, and via conductors (42U) are formed in the third insulation layer 34. On the lower-surface side (on the first surface of the first insulation layer 22), conductive circuits 44 comprised of conductive film 24, electroless plated film 38 and electrolytic plated film 40 are formed, and via conductors (42D) are formed in the first insulation layer 22. The enhanced connection reliability is achieved by providing the via conductors (42U, 42D) by forming the electroless plated film 38 on the inner wall of the openings, and forming the electrolytic plated film 40 on the electroless plated film 38.

The method to form conductive circuits (44, 46), via conductors (42U, 42D) and through-hole conductors 43 is not limited to the above; for example, an SAP (semi-additive) method that is used in forming wiring may be used. The conductive circuits (44, 46) and via conductors (42U, 42D) are preferably formed at the same time.

In the method of manufacturing a printed wiring board according to the first embodiment, a chip capacitor 30 is positioned on the first insulation layer 22 based on alignment marks 27 formed in the laminate body 20. Based on the same alignment marks 27, openings for the via holes 36 that reach terminals (30A, 30B) of the chip capacitor 30 are formed at desired locations. The via conductors (42U, 42D) are formed in the via holes 36 and directly connected to terminals (electrodes) of the chip capacitor 30. By utilizing the same alignment marks 27, the terminals (30A, 30B) of chip capacitor 30 are more precisely aligned with the via conductors (42U, 42D). Accordingly, the connection reliability between the terminals (30A, 30B) of the chip capacitor 30 and via conductors (42U, 42D) is enhanced. In addition, in the multilayer substrate 50 of the first embodiment of the present invention, the chip capacitor 30 is provided on the laminated body 20 having the first insulation layer 22 and the conductive film 24. Because the chip capacitor 30 is not directly in contact with the conductive film 24, wrinkles are seldom formed in the conductive film (copper foil) 24. Accordingly, defects such as wiring breakage due to a snap in the warped portion or connection breakage due to warping where via conductors are formed are minimized or do not occur. Therefore, this manufacturing method achieves improved productivity of printed wiring boards.

Furthermore, the use of the laminate body 20 (such as a single-sided copper-clad laminate) makes the handling easier. Because the first insulation layer 22 and conductive film 24 are adhered beforehand, thermal shrinkage during the curing process of the first insulation layer 22 seldom causes warping in the conductive film 24.

The first insulation layer 22 and the third insulation layer 34 may be comprised of thermosetting resin and inorganic filler (glass fibers and aramid fibers are not contained). As for inorganic filler, for example, $Al_2O_3$, MgO, BN, AlN or $SiO_2$ may be used. The amount of the inorganic filler in such a case is preferred to range from about 30 wt. % to about 90 wt. %. As for thermosetting resin, for example, epoxy resin, phenolic resin or cyanate resin, which is highly heat resistant, is preferred. Among those, epoxy resin, with excellent heat resistance, is especially preferred.

In the first embodiment, chip capacitor 30 is incorporated in the printed wiring board. Instead of the chip capacitor 30, electronic components such as an IC chip, a resistor or an inductor may be built in.

Second Embodiment

In the following, a printed wiring board according to a second embodiment of the present invention is described with reference to FIGS. 6(A)-6(C). The members described in the first embodiment are referred to by the same numbers.

FIGS. 6(A) and 6(B) are cross-sectional views of the laminate body 20. FIG. 6(C) is a plan view showing an alignment mark viewed from the direction of "C" in FIG. 6(B). In the first embodiment, the alignment marks 27 are through-holes 26 that penetrate the laminated body 20 (see FIGS. 1(D) and 2(C)). In the second embodiment, as shown in FIG. 6(C), an alignment mark 27A is formed to have a conductive portion 26A and an insulative portion 22A. The alignment mark 27A is formed by removing (e.g., etching) a portion of conductive film 24 in the laminate body 20.

The alignment mark 27A may have, for example, a shape of a double circle or more complex configurations. By using alignment marks 27A that have complex shapes, lines or images, the accuracy in detecting the alignment marks 27A is enhanced, and thus the accuracy in positioning other members based on the alignment marks 27A is further improved. An alignment mark 27A shown in FIG. 6(C) is structured with conductive portion 26A and insulation portion 22A where a part of the first insulation layer 22 is exposed (a portion without the conductive film 24), and the conductive portion 26A is surrounded by the insulation portion 22A. A portion of the conductive film 22 However, the alignment mark 27A may be formed to have a conductive portion surrounding the insulation portion.

Third Embodiment

Next, a printed wiring board according to a third embodiment of the present invention is described with reference to FIGS. 7(A)-7(C) and FIGS. 8(A)-8(C). The members described in the previous embodiments are referred to by the same numbers.

FIG. 8(C) shows a multilayer substrate (50A) of the third embodiment. Multilayer substrate (50A) is structured with IC chip 31, second insulation layer 32 having an opening portion (32A) to accommodate the IC chip 31, first insulation layer 22 covering one side of the opening portion (32A), adhesive layer 28, filling resin 100, via conductors (42D) and conductive circuits 44. The second surface of the first insulation layer 22 is the one opposite the surface where the electrodes of the IC chip 31 are formed. In the first embodiment, the chip capacitor 30 is accommodated inside the printed wiring board. In contrast, in the third embodiment, to accommodate IC chip 31, via conductors (42D) are formed on the lower-surface side (the first insulation layer 22) where IC-chip terminals (electrodes) (31A, 31B) are formed.

The method of manufacturing the multilayer substrate (50A) is described below by referring to FIGS. 7(A)-8(C). As shown in FIG. 7(A), IC chip 31 is loaded on a laminated body 20 (for example, single-sided copper-clad laminate) in the same manner as the first embodiment described above with reference to FIGS. 1(A)-1(D). The IC chip 31 is mounted on the adhesive layer 28 formed on the first insulation layer 22. The position of the IC chip 31 is determined based on the alignment marks (through-holes 26) formed in the laminate body 20.

As shown in FIG. 7(B), prepreg (32α) with opening portion (32A) to accommodate IC chip 31 is laminated on the laminate body 20. Opening portion (32A) is formed based on alignment marks (through-holes 270) formed in prepreg (32α). Also, the IC chip 31 is positioned based on the alignment marks (through-holes 26) formed in the laminate body 20. Thus, opening portion (32A) of the prepreg is properly aligned with the IC chip 31. Based on the alignment marks 26 formed in the laminate body 20 and the alignment marks 270 formed in the prepreg, prepreg (32α) is laminated on the laminate body 20. The IC chip 31 is positioned accurately and properly accommodated in the opening portion (32A).

By thermopressing, for example, the laminate body 20 and the prepreg (32α) are integrated with each other, and the prepreg (32α) is cured. The space in the opening portion (32A) (the space around the IC chip 31 and the adhesive layer 28) is filled with resin from the prepreg (32α).

Next, filler resin 100 is provided by thermosetting the resin filled in the opening portion (32A). Here, the filling resin 100 is preferred to be comprised of thermosetting resin and inorganic filler. As for inorganic filler, for example, $Al_2O_3$, MgO, BN, AlN or $SiO_2$ may be used. The amount of the inorganic filler is preferred to range from about 30 wt. % to about 60 wt. %. As for thermosetting resin, for example, epoxy resin, phenolic resin or cyanate resin, which has high tolerance to heat, is preferred. Among those, epoxy resin, with excellent heat resistance, is especially preferred. The IC chip 31 is accommodated in the second insulation layer 32 (FIG. 7(C)).

Based on either the alignment marks (through-holes 270) in the second insulation layer 32 or the alignment marks (through-holes 26) in the laminate body 20, the conductive film 24 is patterned by using a subtractive method. Here, portions of the conductive film 24 (for example, copper foil) corresponding to the electrodes of the IC chip 31 are removed to form openings 110 in the conductive film 24 (FIG. 8(A)).

Resin may fill or overflow the through-holes 270 or through-holes 26, thus making it harder to recognize the alignment marks (through-holes 270 or through-holes 26). In such a case, edge portions (27') of the conductive film 24 defining openings in the conductive film 24 which are formed when making through-holes 26 may be used as alignment marks. Since the resin inside the openings and their surrounding conductive film 24 have different coefficients in light reflection and X-ray penetration, the edge portions (27') of the openings work as alignment marks. Alternatively, new second alignment marks may be formed based on the alignment marks (through-holes 270) in the second insulation layer or the alignment marks (through-holes 26) in the laminated body 20, and based on the second alignment marks, openings 110 may also be formed. Here, as the second alignment marks, through-holes that penetrate the second insulation layer 32 and the laminated body 20, or the pattern shown in FIG. 6(C) may be used as alignment marks.

A laser is applied to precise positions inside the openings 110 in the conductive film 24, based on the alignment marks (through-holes 26) in the laminated body 20, the alignment marks (through-holes 270) in the second insulation layer 32, or the second alignment marks. As a result, via holes (36D) for via conductors (42D) that reach the terminals of the IC chip 31 are formed (FIG. 8(B)). Next, on the first surface of the first insulation layer 22 where the via holes (36D) are formed, electroless plated film 38 is formed. Electrolytic plated film 40 is formed on the electroless plated film 38. For example, copper is preferred for electroless plated film 38 and electrolytic plated film 40. After that, based on alignment marks or the second alignment marks, using a subtractive method, conductive circuits 44 are formed on the first surface of the first insulation layer 22 along with via conductors (42D) which connect conductive circuits 44 and the electrodes of the IC chip 31 (FIG. 8(C)).

Fourth Embodiment

Next, a printed wiring board according to the fourth embodiment of the present invention is described with reference to FIGS. 9(A)-9(C) and 10(A)-10(C). The members described in the previous embodiments are referred to by the same numbers. As shown in FIG. 10(C), multilayer substrate (50B) according to the fourth embodiment has third insulation layer 34, conductive circuits 46 on the third insulation layer 34 and through-hole conductors 330 in addition to the multilayer substrate (50A) in the third embodiment. Also, the multilayer substrate (50B) has conductive circuits 44 (the conductive circuits formed on the first surface of the first insulation layer 22) including conductive circuits (44A) that connect the through-hole conductors 330 and the via conductors (42D) connected to the electrodes of the electronic component such as the IC chip 31.

In the manufacturing method of the fourth embodiment, the procedures leading to the loading of an IC chip 31 on the laminated body are the same as in the third embodiment. After those steps, as shown in FIG. 9(A), prepreg (34α) and conductive film (for example, copper foil) 210 are laminated on prepreg (32α) of FIG. 7(B). Next, the laminate body 20, prepregs (32α, 34α) and conductive film 210 are thermopressed and adhered to one another. Also, opening portion (32A) is filled with filling resin 100 comprised of resin and inorganic filler (FIG. 9(B)). Similarly to the third embodiment, portions of the conductive film 210 corresponding to the terminals of the IC chip 31 are removed, and openings 110 are formed (FIG. 9(C)).

As illustrated in FIG. 10(A), via holes (36D) that reach the electrodes (31A, 31B) of the IC chip 31 are formed. Furthermore, through-holes 220 are formed to penetrate the conductive film 24 on the first surface of the first insulation layer 22, the first insulation layer 22, the second insulation layer 32, the third insulation layer 34 and the conductive film 210 on the second surface of the third insulation layer 34.

Next, electroless plated films 38 and electrolytic plated films 40 are formed to cover all the exposed surfaces of the multilayer substrate (50B) including the inner walls of via holes (36D) and through-holes 220. Via conductors (42D) and through-hole conductors 330 are thereby formed (FIG. 10(B)).

Conductive circuits (46, 44 (44A)) are formed, by conducting a patterning using a subtractive method, on the first surface of first insulation layer 22 and on the second surface of third insulation layer 34 (FIG. 10(C)). Conductive circuits 44 on the first surface of first insulation layer 22 and conductive circuits 46 on the second surface of third insulation layer 34 are electrically connected via through-hole conductors 330. Also, conductive circuits 44 on the first surface of first insulation layer 22 and IC chip terminals (31A, 31B) are connected through via conductors (42D) formed on the terminals.

The multilayer substrates (50A, 50B) of the third and fourth embodiments described above can be used as a core substrate of a built-up multilayer printed wiring board as the multilayer substrate 50 of the first embodiment shown in FIG. 4. Built-up multilayer printed wiring boards may be formed by alternately laminating conductive circuits and interlayer insulation layers having via conductors on the core substrate (multilayer substrates (50A, 50B)) having an electronic component accommodated therein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of manufacturing a printed wiring board, comprising:
    providing a laminate body comprising a first insulation layer and a conductive film provided on a first surface of the first insulation layer;
    forming an alignment mark in the laminate body by removing at least a portion of the conductive film;
    providing an adhesive layer on a second surface of the first insulation layer opposite to the first surface, the adhesive layer being provided at a position determined based on the alignment mark;
    placing an electronic component on the adhesive layer at a position determined based on the alignment mark;
    providing a second insulation layer having an opening for enclosing an electronic component on the second surface of the first insulation layer such that the electronic component is positioned in the opening;
    forming a third insulation layer over the second insulation layer to enclose the electronic component inside the opening of the second insulation layer;
    forming a via hole in the laminate body to expose a terminal of the electronic component, the via hole being formed at a position determined based on the alignment mark;
    plating a surface of the laminate body and a surface of the via hole to form a via conductor in the via hole and to form a conductive layer on the laminate body, the via conductor being connected to the terminal of the electronic component; and
    patterning the conductive layer to form a conductive circuit connected to the via conductor.

2. The method of claim 1, wherein forming the alignment mark comprises forming a through-hole that penetrates the laminate body.

3. The method of claim 1, further comprising:
    detecting the alignment mark from a side of the second surface of the first insulation layer to determine the position of the electronic component; and
    detecting the alignment mark from a side of the first surface of the first insulation layer to determine the position of the via hole.

4. The method of claim 1, wherein forming the alignment mark comprises removing a portion of the conductive film and exposing a part of the first insulation layer.

5. The method of claim 1, wherein the first insulation layer is prepared by impregnating a core material with a resin material and curing the core material, and the conductive film is provided on the first insulation layer to provide the laminate body.

6. The method of claim 1, wherein an uncured resin material to be the first insulation layer, an uncured resin material to be the second insulation layer, and the electronic component are thermopressed to press out the resin material from the first insulation layer and the second insulation layer, fill a space inside the opening with the resin material and cure the resin material to fix the electronic component inside the opening.

7. The method of claim 1, further comprising providing a filler inside the opening to fix the electronic component therein, wherein the filler comprises a thermosetting resin and at least one inorganic filler selected from a group consisting of $Al_2O_3$, $MgO$, $BN$, $AlN$ and $SiO_2$.

8. The method of claim 7, wherein the filler comprises about 30 wt. % to about 60 wt. % inorganic filler.

9. The method of claim 1, including forming the via hole by a laser.

10. The method of claim 1, wherein forming the via conductor comprises forming an electroless plated film on the surface of the through-hole and forming an electrolytic plated film on the electroless plated film.

11. The method of claim 1, wherein the conductive film comprises copper foil.

12. The method of claim 1, wherein the laminate body comprises a single-sided copper-clad laminate.

13. The method of claim 1, further comprising roughening a surface of the conductive circuit.

14. The method of claim 1, further comprising roughening a surface of the via conductor.

15. The method of claim 1, further comprising:
    forming a through-hole penetrating the conductive film, the first insulation layer, the second insulation layer, and the third insulation layer; and
    forming a through-hole conductor in the through-hole.

16. The method of claim 15, wherein the conductive film is connected to the through-hole conductor.

* * * * *